(12) United States Patent
Hwang et al.

(10) Patent No.: US 6,410,377 B1
(45) Date of Patent: Jun. 25, 2002

(54) METHOD FOR INTEGRATING CMOS SENSOR AND HIGH VOLTAGE DEVICE

(76) Inventors: Ching-Chun Hwang, 11F-1B, No. 169-10, Sec. 3, His-Tun Rd., Taichung City; Sheng-Hsiung Yang, 26, Alley 5, Lane 10, Min-Yu 2nd St., Hsin-Chu City, both of (TW)

( * ) Notice: Subject to any disclaimer, the term of this patent is extended or adjusted under 35 U.S.C. 154(b) by 3 days.

(21) Appl. No.: 09/707,128

(22) Filed: Nov. 6, 2000

(51) Int. Cl.$^7$ ............... H01L 21/8238; H01L 21/8249; H01L 21/8234; H01L 21/00
(52) U.S. Cl. .............. 438/200; 438/202; 438/204; 438/207; 438/234; 438/237; 438/48
(58) Field of Search .................. 438/238, 48, 142, 438/186, 196, 197, 199, 204, 207, 217, 218, 234, 237, 326, 514, 787, 200, 202

(56) References Cited

U.S. PATENT DOCUMENTS

| | | | | |
|---|---|---|---|---|
| 6,096,589 A | * | 8/2000 | Lee et al. | 438/225 |
| 6,169,318 B1 | * | 1/2001 | McGrath | 257/445 |
| 6,303,419 B1 | * | 10/2001 | Chang et al. | 438/202 |
| 6,306,700 B1 | * | 10/2001 | Yang | 438/217 |

* cited by examiner

*Primary Examiner*—Michael S. Lebentritt
*Assistant Examiner*—Adam Pyonin

(57) ABSTRACT

The present invention provides a method for integrating the fabrication of a sensor and a high voltage devices. The N conductive type sensor has a P conductive type doped region in the substrate of the sensor active region to effectively reduce the leakage at edges of the field oxide. Furthermore, there are the P conductive type field and the P conductive type well used as isolations for the sensor and these isolations can prevent blooming. Between these isolations, high voltage devices can be simultaneously formed thereon.

19 Claims, 5 Drawing Sheets

METHOD FOR INTEGRATING CMOS SENSOR AND HIGH VOLTAGE DEVICE

BACKGROUND OF THE INVENTION

1. Field of the Invention

The present invention generally relates to a method for integrating processes in integrated circuits, and, more particularly, relates to a method for integrating a fabrication of a CMOS sensor and a high voltage device.

2. Description of the Prior Art

A photo diode based on the theorem of a P-N junction can convert light into an electrical signal. Before energy in the form of photons strikes the photo diode, there is an electric field in the P-N junction. The electrons in the N region do not diffuse forward to the P region and the holes in the P region do not diffuse forward to the N region. When enough light strikes the photo diode, the light creates a number of electron-hole pairs. The electrons and the holes diffuse forward to the P-N junction. While the electrons and the holes reach the P-N junction as a result of the effect of the inner electric field across the junction, the electrons flow to the N region and the holes flow to the P region. Thus, a current is induced between the P-N junction electrodes. Ideally, a photo diode in the dark is open-circuit. In other words there is no current induced by light while the photo diode is in the dark.

High voltage devices are currently being used in many applications. For example, high voltage devices are required to program or erase a non-volatile memory cell. A lateral diffusion MOS (LDMOS) transistor has a lower "on" resistance, a faster switching speed, and a lower gate drive power dissipation.

On the development of Ultra Large Scale Integrated (ULSI), the application of a product is going to depend on a multi-chip of an integrated function. Accompanying this trend, it is valuable to integrate different kinds of applied devices, such as CMO sensors, high voltage device and low voltage device, etc. Consequentially, it is necessary to find a method of integrating a CMOS sensor and a high voltage device.

SUMMARY OF THE INVENTION

An object of the present invention is to provide a method for integrating a fabrication of a CMOS sensor and a high voltage device.

Another object of the invention is using the P conductive type field and the P conductive type well as isolations to increase the effect of isolation and forming high voltage devices between these isolations.

In order to achieve the stated objects of the invention, the method of the present invention comprises the following steps: First, a substrate of a first conductive type is provided with a first region and a second region. Then, a first well of a second conductive type is formed in the substrate of the second region, the second conductive type being opposite to the first conductive type. Next, a plurality of filed oxide regions are formed on the substrate to define a first active region of the sensor in the first region and a second active region of the high voltage device in the second region. The first well is in a lateral position with respect to the substrate of the second active region and one of the field oxide regions is floating on the first well. Next, a first doped region of the second conductive type of formed in the substrate of the first active region of the sensor and in the substrate of the second region of the first well. The first doped region in the second region caps the field oxide region in the first well. Thereafter, a second well of the first conductive type is formed in the substrate, wherein the second well in the first region is under each one of the field oxide regions and the second well in the second region is adjacent to the first well in the second active region. Then, a gate oxide layer is formed on the substrate except on the field oxide regions. Next, a polysilicon gate electrode is formed covering a portion of the second well and a portion of the first well in the second active region, wherein the polysilicon gate electrode is also covering a portion of the field oxide region on the first well. Last, a source region and a drain region are formed in the substrate of the second active region. The source region is in the substrate of the second well around the polysilicon gate electrode. The drain region is in the substrate of the first well around a lateral of the field oxide region which is not covered by the polysilicon gate electrode.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, while the present invention is illustrated by a number of preferred embodiments directed to silicon semiconductor devices, it is not intended that illustrations be a limitation on the scope of applicability of the present invention. Further, while the illustrative examples use insulated gate control structures, it should be recognized that the insulated gate portions maybe replaced with light activated or current activated structure(s). The illustrated devices are included to demonstrate the utility and application of the present invention to presently preferred embodiments.

Moreover, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual function of the illustrated device. Enhancement and depletion mode structures may be similarly interchanged.

Moreover, although the embodiments illustrated herein are shown in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1:
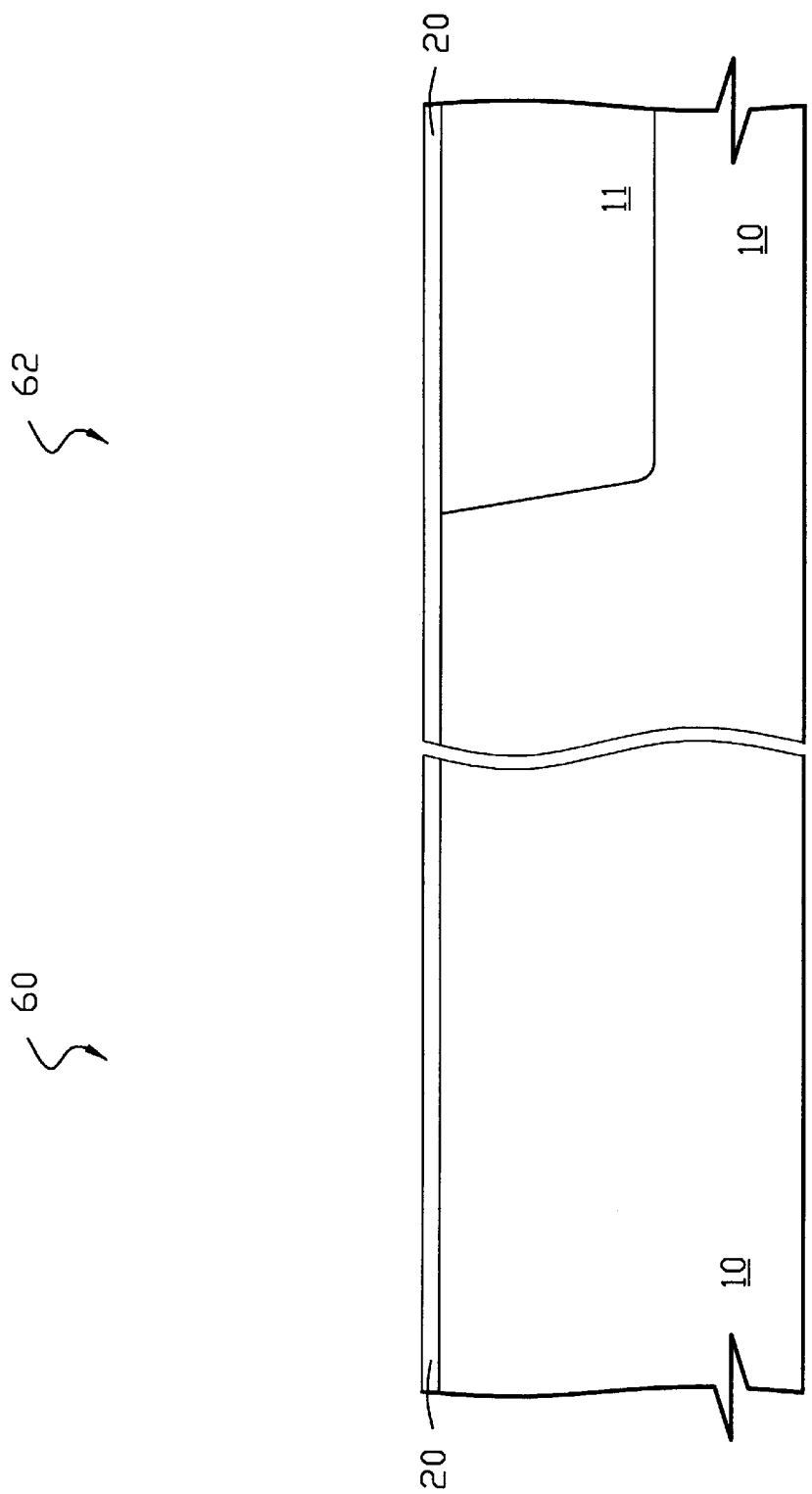
FIG. 1 is the schematic representation of the structure of the present invention after forming an oxide layer and a first well in the substrate.

Referring to FIG. 1, first, a substrate 10 of the P conductive type is provided. The substrate 10 is divided into a first region 60 for forming a photo diode and a second region 62 for forming a lateral diffusion MOS (LDMOS) transistor. Then, an oxide layer 20 about a thickness between 100 to 300 angstroms is formed on the substrate 10 by thermal oxidation method. Next a first well 11 of the N conductive type is formed in one side of the substrate 10 of the second region 62. The first well 11 is formed by ion implantation and then annealing, and the oxide layer 20 is used to reduce the channeling effect.

Figure 2:
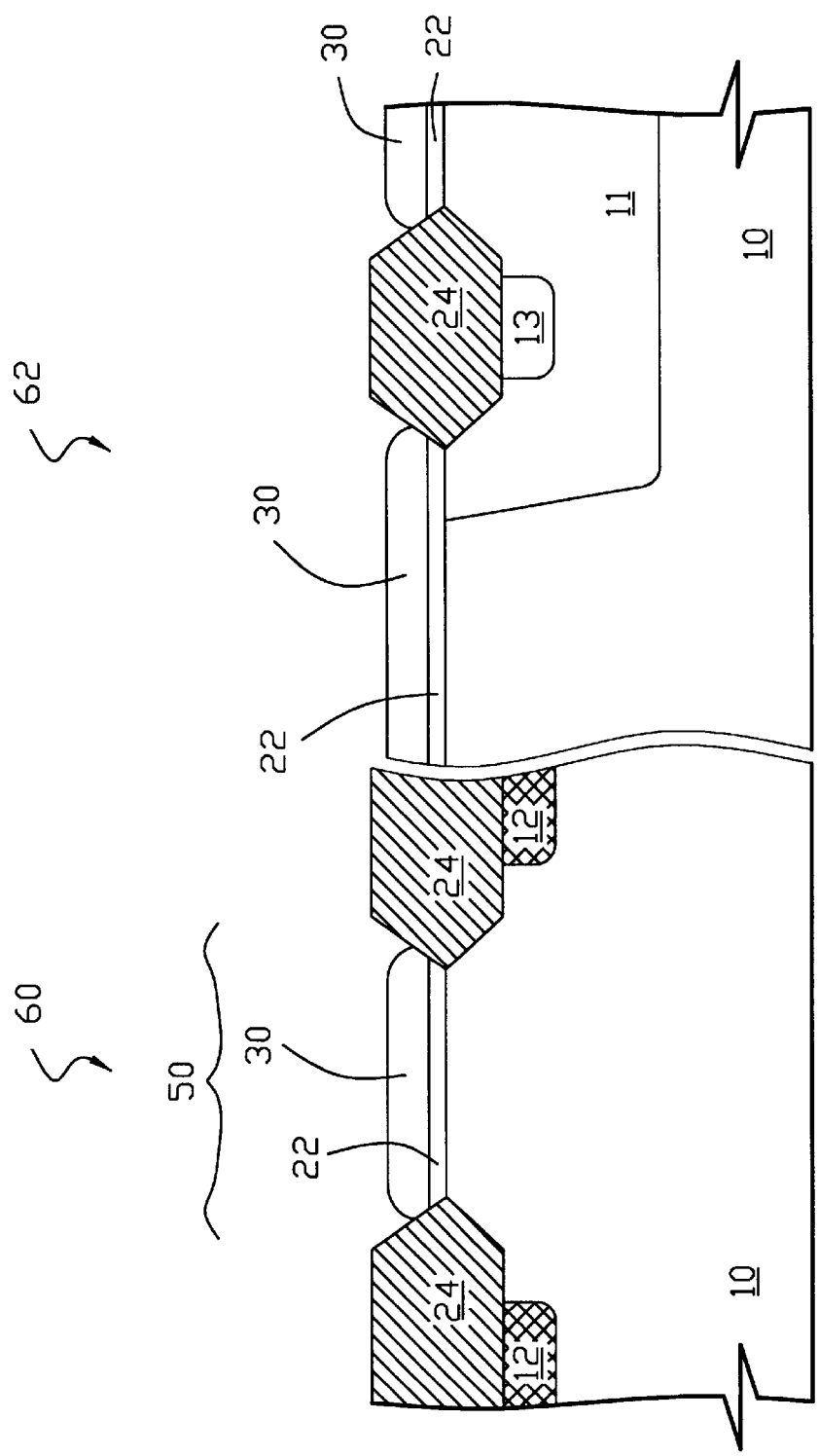
FIG. 2 is the structure of FIG. 1 after forming insulation regions on the substrate.

Referring to FIG. 2, after removing the oxide layer 20 on the substrate 10, a pad oxide layer 22 and silicon nitride layer 30 are sequentially formed on the substrate 10. The pad oxide layer 22 is formed by thermal oxidation method and the silicon nitride layer 30 is formed by chemical vapor deposition. Then, the silicon nitride layer 30 is etched to define a region for forming field oxide. Thereafter, a plurality of field regions 24 is formed on the substrate 10 using a field oxidation process, such as a wet oxidation process. Those field oxide regions 24 in the first region 60 define a sensor active region 50 and the field oxide region 24 in the second region 62 is floating on the first well 11. Before the field oxidation process, the present method further comprises a step of forming a first field region 12 and a second field region 13 under each one of those field oxide regions 24. The first field region 12 is in the P conductive type and is under field oxide regions 24 in the first region 60. The second field region 13 is in the N conductive type and is capped by the first well 11 and under the field oxide region 24.

Figure 3:
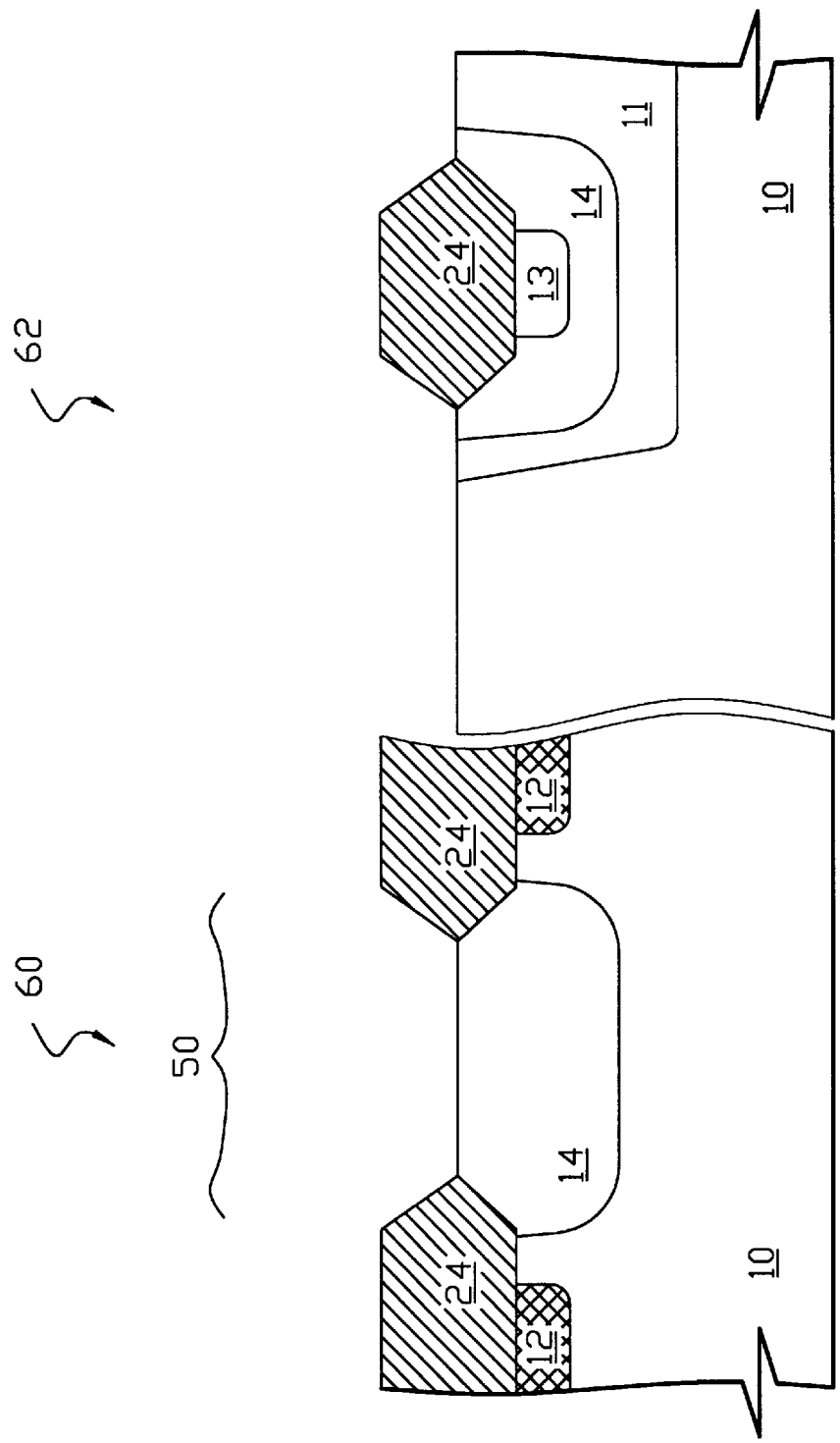
FIG. 3 is the structure of FIG. 2 after forming the doped region in the sensor active region.

Referring to FIG. 3, then, the silicon nitride layer 30 and the pad oxide layer 22 are removed. Thereafter, an implanting process is performed to form a first doped region 14 of the N conductive type in the substrate 10 of the sensor active region 50 and in the first well 11 which is capping the second field region 13 and the field oxide region 24.

Figure 4:
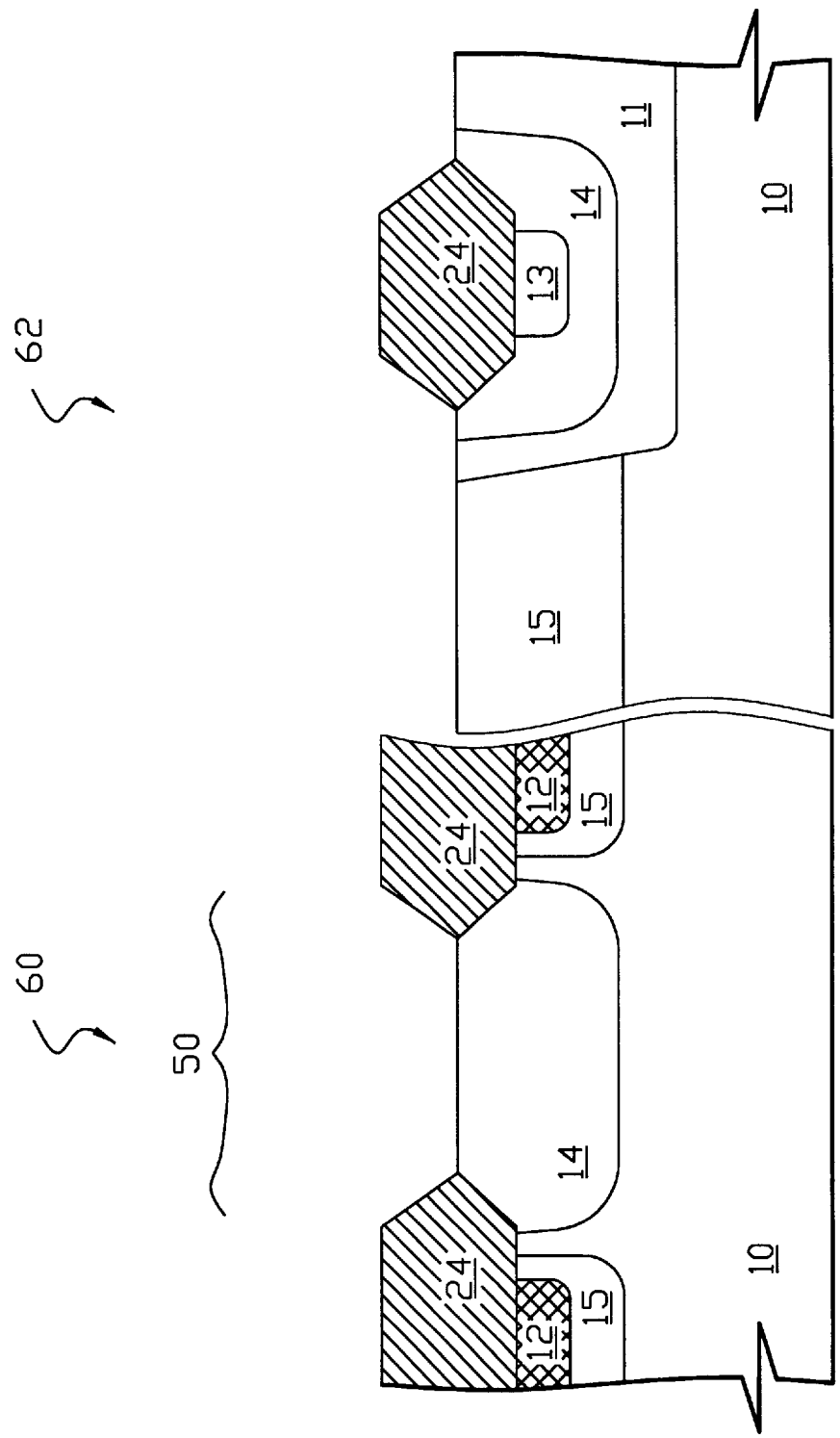
FIG. 4 is the structure of FIG. 3 after forming a second well in the substrate.

Referring to FIG. 4, a second well 15 of the P conductive type is formed in the substrate 10 in the first region 60 and the second region 62 by ion implantation. The second well 15 in the first region 60 is in the substrate 10 under field oxide regions 24 and caps the first field region 12. The second well 15 is in the second region 62 is in the substrate 10 except for the region of the first well 11.

Figure 5:
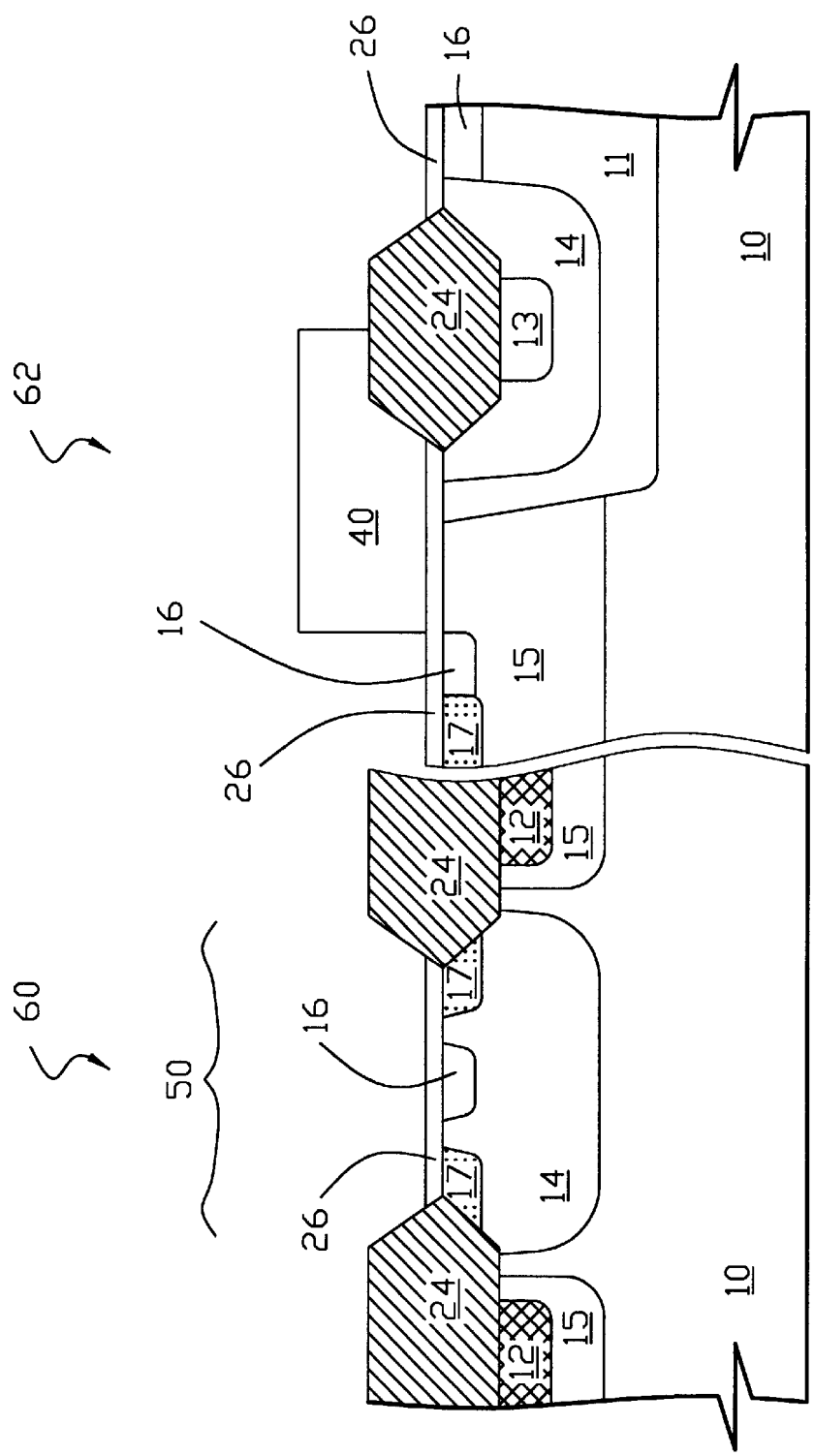
FIG. 5 is the structure of FIG. 4 after forming the polysilicon gate electrode and the source/drain region in the high voltage device.

Referring to FIG. 5, subsequently, a gate oxide layer 26 is formed on the substrate 10 except on the field oxide regions 24 by thermal oxidation method. Next, a polysilicon gate electrode 40 is formed on the substrate 10 in the second region 62. The polysilicon gate electrode 40 is formed by a chemical vapor depositing process and a lithography process. The polysilicon gate electrode 40 covers a portion of the second well 15 and a portion of the first well 11 specifically covering a portion of the field oxide region 24 in the first region 11. Then, a second doped region 16 of the N conductive type is formed in the substrate 10 by ion implantation. The second doped region 16 in the second region 62 is used as a source/drain region of the LDMOS transistor. The source region 16 is in the substrate 10 of the second well 15 around the polysilicon gate electrode 40, and the drain region 16 is in the substrate 10 of the firsts well around the field oxide region 24 which is not covered by the polysilicon gate electrode 40. Simultaneously, the second doped region 16 in the first region 60 is in the substrate 10 of the center region of the sensor active region 50 and is used to increase the concentration of ions in the first doped region 14. Next, a third doped region 17 of the P conductive type is formed in the substrate 10 by ion implantation. The third doped region 17 in the first region 60 is in the substrate 10 of the first doped region 14 of the edges of the field oxide region 24.

To sum up the foregoing, the present invention provides a method for integrating a photo diode and a LDMOS transistor. In the sensor, a P conductive type region in the substrate of the sensor active region of the edges of the field oxide regions can effectively prevent leakage. Furthermore, there are the P conductive type field and the P conductive type well used as isolations for the sensor and these isolations can prevent blooming. Between these isolations, the LDMOS transistor of high voltage devices can be simultaneously formed thereon.

Of course, it is to be understood that the invention need not be limited to the disclosed embodiments. Various modification and similar changes are still possible within the spirit of this invention. In this way, the scope of this invention should be defined by the appended claims.

What is claimed is:

1. A method for integrating a CMOS sensor and a high voltage device, said method comprising:

s providing a substrate of a first conductive type with a first region and a second region;

forming a first well of a second conductive type in said substrate of said second region, wherein said second conductive type being opposite to said first conductive type;

forming a plurality of field oxide regions on said substrate to define a first active region of said sensor in said first region and a second active region of said high voltage device in said second region, wherein said first well being in a lateral of said substrate of said second active region, and one of said field oxide regions being floating on said first well;

forming a first doped region of said second conductive type in said substrate of said first active region of said sensor and in said substrate of said second active region of said first well, wherein said first doped region in said second region being capping said field oxide region in said first well;

forming a second well of said first conductive type in said substrate, wherein said second well in said first region being under each one of said field oxide regions, and said second well in said second region being adjacent to said first well in said second active region;

forming a gate oxide layer on said substrate except said field oxide regions;

forming a polysilicon gate electrode covering a portion of said second well and a portion of said first well in said second active region, wherein said polysilicon gate electrode being covering a portion said field oxide region on said first well; and forming a source region and a drain region of said second conductive type in said substrate of said second active region, wherein said source region being in said substrate of said second well around said polysilicon gate electrode, and said drain region being in said substrate of said first well around a lateral of said field oxide region which is not covered by said polysilicon gate electrode.

2. The method according to claim 1, further comprising a step of forming an oxide layer on said substrate before forming said first well.

3. The method according to claim 1, wherein said first well is formed by ions implantation method.

4. The method according to claim 1, wherein said field oxide regions in said first region further comprise a first conductive type field region under each one of said field oxide regions and capped by said second well.

5. The method according to claim 1, wherein said field oxide regions floating on said first well further comprise a second conductive type field region under said field oxide region and capped by said first well.

6. The method according to claim 1, wherein said field oxide regions are formed by following steps:

sequentially forming a pad oxide layer and a silicon nitride layer on said substrate;

etching said silicon nitride layer to define a region for forming said field oxide regions; and performing a field oxidation process to grow said field regions on said substrate.

7. The method according to claim 6, wherein said field oxidation process is a wet oxidation process.

8. The method according to claim 1, wherein said source region and said drain region are formed by ions implantation method.

9. The method according to claim 8, further comprises simultaneously forming a second doped region of said second conductive type in said substrate of the center of said first active region.

10. The method according to claim 8, further comprises forming a third doped region of said first conductive type in said substrate of said first active region of edges of said field oxide regions.

11. A method for integrating a CMOS sensor and a high voltage device, said method comprising:

providing a substrate of a first conductive type with a first region and a second region;

forming an oxide layer on said substrate;

forming a first well of a second conductive type in said substrate of said second region by ions implantation method, wherein said second conductive type being opposite to said first conductive type;

forming a plurality of field oxide regions on said substrate to define a first active region of said sensor in said first region and a second active region of said high voltage device in said second region, wherein said first well being in a lateral of said substrate of said second active region, one of said field oxide regions being floating on said first well, said field oxide regions in said first region further comprising a first conductive type field region under each one of said field oxide regions and be capped by said second well, and said field oxide regions floating on said first well further comprising a second conductive type field region under said field oxide region and be capped by said first well;

forming a first doped region of said second conductive type in said substrate of said first active region of said sensor and in said substrate of said second active region of said first well, wherein said first doped region in said second region being capping said field oxide region in said first well;

forming a second well of said first conductive type in said substrate, wherein said second well in said first region being under each one of said field oxide regions, and said second well in said second region being adjacent to said first well in said second active region;

forming a gate oxide layer on said substrate except said field oxide regions;

forming a polysilicon ga te electrode covering a portion of said second well and a portion of said first well in said second active region, wherein said polysilicon gate electrode being covering a portion said field oxide region on said first well; and forming a source region and a drain region of said second conductive type in said substrate of said second active region by ions implantation method, wherein said source region being in said substrate of said second well around said polysilicon gate electrode, and said drain region being in said substrate of said first well around a lateral of said field oxide region which is not covered by said polysilicon gate electrode.

12. The method according to claim 11, wherein said field oxide regions are formed by following steps:

sequentially forming a pad oxide layer and a silicon nitride layer on said substrate;

etching said silicon nitride layer to define a region for forming said field oxide regions; and forming said first conductive type field region in said first region, wherein said first conductive type field region being under each one of said field oxide regions and capped by said second well;

forming said second conductive type field region in said second active region, wherein said second conductive type field region being under said field oxide region and capped by said first well;

performing a field oxidation process to grow said field regions on said substrate.

13. The method according to claim 11, wherein said field oxidation process is a wet oxidation process.

14. The method according to claim 11, further comprises simultaneously forming a second doped region of said second conductive type in said substrate of the center of said first active region.

15. The method according to claim 11, further comprises forming a third doped region of said first conductive type in said substrate of said first active region of edges of said field oxide regions.

16. A method for integrating a photo diode and a lateral diffusion MOS transistor, said method comprising:

providing a substrate of a first conductive type with a first region and a second region;

forming an oxide layer on said substrate;

forming a first well of a second conductive type in said substrate of said second region by ions implantation method, wherein said second conductive type being opposite to said first conductive type;

forming a plurality of field oxide regions on said substrate to define a first active region of said sensor in said first region and a second active region of said high voltage device in said second region, wherein said first well being in a lateral of said substrate of said second active region, one of said field oxide regions being floating on said first well, said field oxide regions in said first region further comprising a first conductive type field region under each one of said field oxide regions and be capped by said second well, and said field oxide regions floating on said first well further comprising a second conductive type field region under said field oxide region and be capped by said first well;

forming a first doped region of said second conductive type in said substrate of said first active region of said sensor and in said substrate of said second active region of said first well, wherein said first doped region in said second region being capping said field oxide region in said first well;

forming a second well of said first conductive type in said substrate, wherein said second well in said first region being under each one of said field oxide regions, and said second well in said second region being adjacent to said first well in said second active region;

forming a gate oxide layer on said substrate except said field oxide regions;

forming a polysilicon ga te electrode covering a portion of said second well and a portion of said first well in said second active region, wherein said polysilicon gate electrode being covering a portion said field oxide region on said first well;

forming a second doped region of said second conductive type in said substrate of said second well around said polysilicon gate electrode as a source region, in said substrate of said first well around a lateral of said field oxide region which is not covered by said polysilicon gate electrode as a drain region, and in said substrate of the center of said first active region; and forming a third doped of said first conductive type in said substrate of said first active region of edges of said field oxide regions.

17. The method according to claim 16, wherein said field oxide regions are formed by following steps:

sequentially forming a pad oxide layer and a silicon nitride layer on said substrate;

etching said silicon nitride layer to define a region for forming said field oxide regions; and forming said first conductive type field region in said first region, wherein said first conductive type field region being under each one of said field oxide regions and capped by said second well;

forming said second conductive type field region in said second active region, wherein said second conductive type field region being under said field oxide region and capped by said first well;

performing a field oxidation process to grow said field regions on said substrate.

18. The method according to claim 16, wherein said field oxidation process is a wet oxidation process.

19. The method according to claim 16, wherein said second doped region and said third doped region are formed by ions implantation method.

* * * * *